United States Patent [19]
Mayer

[11] Patent Number: 5,481,633
[45] Date of Patent: Jan. 2, 1996

[54] METHOD AND OPTICAL DEVICE PRODUCED OF OPTICAL POLYMER COMPONENTS HAVING INTEGRATED VERTICAL COUPLING STRUCTURES

[75] Inventor: Klaus-Michael Mayer, Gerlingen, Germany

[73] Assignee: Robert Bosch GmbH, Stuttgart, Germany

[21] Appl. No.: 256,972
[22] PCT Filed: Nov. 27, 1993
[86] PCT No.: PCT/DE93/01128
 § 371 Date: Aug. 1, 1994
 § 102(e) Date: Aug. 1, 1994
[87] PCT Pub. No.: WO94/12903
 PCT Pub. Date: Jun. 9, 1994

[30] Foreign Application Priority Data

Dec. 1, 1992 [DE] Germany ............ 42 40 266.2

[51] Int. Cl.⁶ ............... G02B 6/12; B29D 11/00
[52] U.S. Cl. ............... 385/49; 385/14; 385/24; 385/45; 385/52; 385/132; 264/1.1; 264/1.24; 264/1.25
[58] Field of Search ............... 385/24, 30, 14, 385/38, 39, 42, 44, 45, 46, 48, 49, 52, 129, 132; 264/1.1, 1.24, 1.25, 1.29, 1.7

[56] References Cited

U.S. PATENT DOCUMENTS

| | | | |
|---|---|---|---|
| 5,015,059 | 5/1991 | Booth et al. | 385/49 |
| 5,029,971 | 7/1991 | Hunt et al. | 385/49 X |
| 5,077,818 | 12/1991 | Stein | 385/49 |
| 5,091,986 | 2/1992 | Arii et al. | 385/48 |
| 5,165,001 | 11/1992 | Takagi et al. | 385/42 |
| 5,343,544 | 8/1994 | Boyd et al. | 385/46 |
| 5,361,382 | 11/1994 | Nakamura et al. | 385/49 |
| 5,371,820 | 12/1994 | Welbourn et al. | 385/76 |

FOREIGN PATENT DOCUMENTS

| | | | |
|---|---|---|---|
| 59-121008 | 11/1984 | Japan | 385/14 X |
| 01094305 | 7/1989 | Japan | 385/49 X |

OTHER PUBLICATIONS

"Multistructured Optical IC Elements by Polymer Thin Films" I. Kato et al.; Electronics & Communications in Japan, Part I–Communications, vol. 66, No. 2, Feb. 1983, New York, pp. 106–110.

M. J. Wale: "Self Aligned, Flip Chip Assembly of Photonic Devices with Electrical and Optical Connections". 40th Electronic Components & Technology Conference, Las Vegas May 20–23, 1990, pp. 34–41.

N. P. Vlannes: "organic Photonics: A Meterials and Devices Strategy for Computational and Communication Systems". NTC–92, Washington D.C., May 19–20, 1992, pp. 9–7–9–15.

*Primary Examiner*—Brian Healy
*Attorney, Agent, or Firm*—Spencer, Frank & Schneider

[57] ABSTRACT

A method of producing passive and/or active optical polymer components (10) having vertical coupling structures (45), wherein at least one structure (22) for receiving a light waveguide (40; 46), and at least two fiber guide structures (14) and at least two adjusting structures (36) are produced on a substrate plate (32) and on a lid plate (34) such that both the plate and the lid plate possess fiber guide structures (14) with which the adjusting structures (36) located opposite in the lid plate or substrate, plate respectively are associated after assembly, and wherein the light waveguide structures (22) of the substrate plate (32) and the lid plate (34) which connect the fiber guide structures (14) extend parallel to each other in at least one region (45) such that the optical fields in the respective light waveguides (40) can be coupled with one another.

17 Claims, 6 Drawing Sheets

METHOD AND OPTICAL DEVICE PRODUCED OF OPTICAL POLYMER COMPONENTS HAVING INTEGRATED VERTICAL COUPLING STRUCTURES

BACKGROUND OF THE INVENTION

The invention relates to a method of producing optical polymer components having integrated vertical coupling structures, wherein the optical polymer components have regions for receiving light waveguides and fiber guide structures, preferably configured as V-shaped positioning trenches, for receiving optical fiber structures to be coupled to the light waveguides, and the polymer components comprise a polymer substrate and a polymer lid plate. More particularly, the present invention relates to a method of producing optical polymer components, as mentioned above, having integrated vertical coupling structures, and which is used in the mass-production of monomode or multimode components, particularly opto-optical components, of integrated optics having monolithically-integrated fiber-chip coupling.

The increasing use of integrated-optical components for optical communications, for sensory technology and the computer field (optical databus) lends ever-increasing significance to optical connection techniques (chip-fiber coupling) and optical coupling techniques. Smaller, private relay stations having approximately 1000 subscriber stations already require, for example, several thousand optical connections and coupling stations between the individual sub-switching stages, because the number and complexity of the optical components integrated on individual substrates are severely limited due to the extreme aspect conditions in the optics. In such cases the reliability (mechanic and thermal stability) and ability of the optical connection and coupling technology to be realized, and the required connection expenditure ultimately determine the achievable degree of expansion of an optical relay system.

The basic mode of operation of vertical directional couplers is known in which two light waveguides disposed one above the other approach one another so closely over a defined length that a coupling occurs between them and energy can be exchanged. Usually such components are structured in stacked, thin films (film waveguides), with the layer lying between the waveguides determining the coupling strength of the waveguides with its optical thickness. The homogeneity of this intermediate layer is therefore critical for the operation of such components, and technologically difficult to control. Moreover, up to now neither self-adjusting optical connection techniques for such waveguides located at different heights, nor mass-producibilty of such components using an injection-molding technique has been possible.

In known parallel strip couplers, typically coplanar waveguides must be guided precisely adjacently in the coupling region with a few μm lateral spacing over a few hundred μm coupling length. Such structures are difficult to realize using injection-molding techniques, because very narrow webs for the waveguides would have to be produced between trench structures.

So-called imprinting techniques for monomode light waveguides in plastics ("embossing" or photopolymerization) are known from H. Hosokawa et al in the Integrated Photonics Research Conf., (1991). However, neither an arrangement of waveguides one above the other nor the simultaneous production of a substrate-integrated fiber guidance is possible in this technique.

Furthermore, it is known from A. Neyer et al in the Integrated Photonics Research Conf., (1992) to shape waveguide structures in a substrate and then fill this with a light-guiding polymer having a high refractive index. In this instance waveguides can only be created on one side in a substrate layer, but an arrangement of waveguide coupling structures one above the other is excluded.

Moreover, the principle of duplicating microstructures using galvanic shaping and injection-molding is known as the so-called "LIGA" technique. In this technique the primary structures to be shaped are usually created by means of X-irradiation of plastics on a synchrotron, and from there the mold inserts for the injection molding are galvanically produced. An alternating arrangement of higher-lying and lower-lying fiber guide structures, as become necessary for vertical coupling elements, is not possible according to the current state of the LIGA technology, because the necessary X-irradiation principally permits no depth resolution.

SUMMARY AND ADVANTAGES OF THE INVENTION

In contrast, the method of the invention, according to the characteristics of the main claim, offers the advantage that a mass-scale production of polymer components having integrated vertical coupling structures with high coupling precision is possible in a simple manner.

According to the present invention, both passive as well as opto-optically active or acousto-optical components of the integrated optics can be mass-produced with monolithically-integrated fiber-chip coupling.

For this purpose, according to the basic concept of the invention, it is provided that respectively at least one structure for receiving a light waveguide and respectively at least two fiber guide structures, as well as respectively at least two adjusting structures, are produced on the substrate plate and on the lid plate in such a way that both the substrate plate and the lid plate possess fiber guide structures with which the adjusting structures located opposite in the substrate plate or lid plate are associated after assembly, and the light waveguide structures of the substrate plate and the lid plate which connect the fiber guide structures extend parallel to each other in at least one region.

Further advantageous embodiments ensue from the measures disclosed in the dependent claims.

Using known anisotropic etching techniques of the silicon, in a simple manner V-shaped trench structures are etched into {100} oriented wafers which create the substrate plate and the lid plate, resulting in a highly-precise structure by way of which the later exact position of glass fiber structures and waveguide structures with respect to one another is defined.

Such a V-groove is particularly suited as a fiber guide structure and adjusting structure, because the angular adjustment, parallel to the crystal surface, is automatically set, and the height position of the fiber core can be set exactly over the wafer surface by way of the opening width of the V-groove and controlled using production techniques.

In an advantageous manner, the V-grooves are filled with polymer materials, and the resulting planar surface is subsequently coated with a photoresist or another polymer that can be structured. Trench-shaped openings that define the dimensions of the later light waveguides are structured into the cover layer in this manner.

Moreover, the V-grooves are subsequently re-opened by means of excimer laser ablation techniques known per se, and in a particularly advantageous manner, vertical fiber structure stops are cut at the end of the V-grooves on the side of the light waveguide.

In a further advantageous embodiment of the invention, it is provided that the master structures are shaped from light waveguide structures and integrated fiber guide structures and adjusting structures by means of galvanization methods known per se.

The negative form resulting in this manner is used to produce numerous daughter copies of the master structure. This is advantageously effected by means of injection-molding or injection-embossing methods in the polymer material.

According to the invention, the trench-shaped openings, later forming the light waveguides, are structured such that they respectively connect two fiber guide structures located opposite one another in the substrate plate or lid plate, and have at least one region in which, after assembly, the opening for the substrate plate-side light waveguide extends vertically spaced and parallel to the opening for the lid plate-side light waveguide.

Because of the intrinsic design of the component with vertical coupling structures instead of coplanar, adjacent coupling arms (the usual embodiment of directional coupling components), it is particularly possible to pour different materials into the upper and lower openings which form the light waveguides. Because of this, for example, undesirable damping losses of a particular opto-optically active material in the other optical connection plane can be avoided, or separate switching effects can be achieved above and below (polymer substrate plate and polymer lid plate) by means of control light beams of different wavelengths. The control light can also principally be guided in the same light waveguide (fiber) as the signal light to be switched.

In an advantageous manner, a method has been proposed for mass-production-capable design of different polymer components having vertical coupling structures, which are considered both for passive components, such as, for example, 2×2-directional couplers or star couplers/power dividers, and optically-controlled optical switching elements having a two-layer optical design. Particularly advantageous is the chip-integrated, simultaneous production of fiber guide structures for a self-adjusting optical contacting of the coupling components on two different planes.

Moreover, the self-adjusting adjustment technique in the assembly of the components is advantageous, in which not only the fibers are passively adjusted to the light waveguides, but the polymer lid and bottom plates (substrate plates) also "lock in place" to fit perfectly with one another. Because of the vertical arrangement of the light waveguides, the coupling distance of all components of a chip can be easily controlled technologically by the thickness of the worked-in polymer film.

The ability of different core polymers to be freely combined in the lower and the upper plane of the component can have many applications; for example, at least one of the polymers is doped with $X^{(3)}$ materials in order to obtain optical switching functions.

Also in an advantageous manner, the inserted polymer film itself can effect a switching function in that acousto-optical effects, for example in a piezoelectric film (PVDF film), lead to an adaptation of the expansion constants of the light in differently-dimensioned light waveguides below and above, and thus trigger a switching behavior of the couplers induced by acoustic phonon absorption.

BRIEF DESCRIPTION OF THE DRAWING

Embodiments of the invention are represented in the drawings and described in detail in the following description wherein.

Shown are in.

DETAILED DESCRIPTION OF THE PREFERRED EMBODIMENTS

Figure 1:
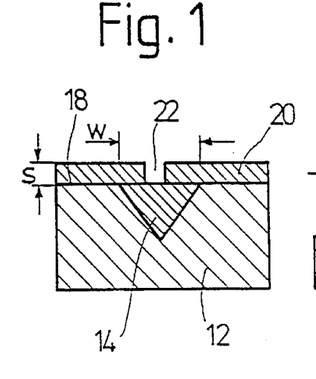
FIG. 1 is a cross-section of a master structure for a fiber guide structure.
Figure 2:
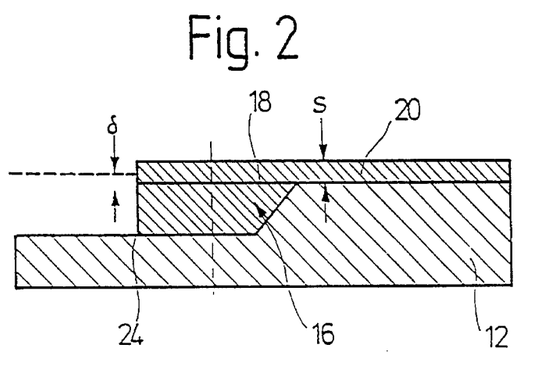
FIG. 2 is a side view according to FIG. 1.

The master structure illustrated in FIGS. 1 and 2 is intended to clarify the integrated fiber-chip coupling of a polymer component 10 (FIG. 7) by way of example. In fact, a number of fiber-chip couplings are disposed on each polymer component. The fiber-chip coupling is, however, essentially a precondition for the later-described, actual vertical coupling structure.

The master structure—here represented on the side of the substrate plate—comprises a silicon substrate 12, into which a fiber guide structure 14 (positioning trench) having a V-shaped cross-section is anisotropically etched in order to receive a glass fiber not shown here.

By means of the anisotropic etching techniques of the silicon, which are known per se, V-shaped trench structures can be etched into the {100} oriented wafer, with the depth of these trenches being set as a function of the width of a rectangular opening w in the etching mask parallel to the <110> direction. The inclined {111} side surfaces forming create a natural etching stop defined by the anisotropic etching properties of the crystal. Such a V-groove is particularly suited as a fiber guide structure 14, because the angular adjustment (parallel to the crystal surface) is set automatically, and the height position δ of the fiber core can be set exactly above the wafer surface by way of the opening width of the V-groove, and can be controlled with production technology.

The following relationship applies for the later height position of the fiber core:

$$\delta = \frac{R}{2\cos\alpha} - \frac{w}{2}\tan\alpha$$

with R=fiber jacket diameter (typ. 125 μm), α=angle of inclination of the {111} surfaces in relation to the wafer surface (α=54.7356°), w=width of the V-groove at the wafer surface. A change in Δ w=1 µm results in a change in the height position Δδ=0.7 µm.

After etching of the V-grooves in silicon, these are planated (filled to be planar) with polymer materials 16, so that a planar surface 18 results for the subsequent coating with photoresist or another polymer 20 that can be structured. Structured into this cover layer 20 of a thickness s are trench-shaped openings 22 which define the dimensions of the later light waveguides (the height position of the fiber core above the wafer surface in this example would have to be δ=3 µm, so that the optical axes of light waveguides and glass fibers are aligned) and which have typical dimensions of 6 µm×6 µm cross-section surface (=structure width×layer thickness s).

The fiber guide structures 14 are subsequently partially re-opened, preferably by means of excimer laser ablation technique, and a vertical fiber stop 24 is thereby cut at the end of the V-groove on the side of the light waveguide. This technique permits a guidance of the light waveguides in the openings 22 beyond the diagonal end surfaces of the V-grooves to a vertically-cut stop, so that optical fibers (glass fibers) and light waveguides can be coupled with one another directly end-to-end.

The lateral adjustment of the light waveguides adjoining the fibers can be achieved with sufficient precision using conventional techniques of photolithography.

Figure 3:
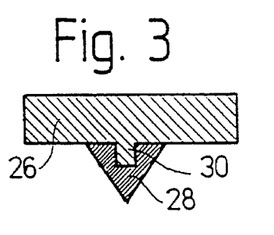
FIG. 3 is a negative form for a fiber guide structure.
Figure 4:
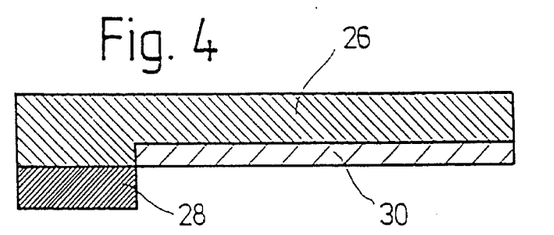
FIG. 4 is a side view according to FIG. 3.

According to FIGS. 3 and 4, this master structure of light waveguide prestructures (opening 22) and integrated fiber guide structures 14 is shaped on silicon using conventional galvanic methods, so that a negative form 26, for example of nickel, is created. The negative form 26 has a region 28 that imitates the fiber guide structure 14, and a region 20, which imitates the opening 22. With this negative form 26, numerous daughter copies of the master structure can be produced in the polymer material (e.g. PMMA or polycarbonate) by means of injection-molding or injection-embossing methods.

As already mentioned, in the example only one fiber guide structure 14 of a polymer substrate plate is described in detail. The finished polymer component 10, however, possesses a number of fiber guide structures 14, and the openings 22 which later form the light waveguides. Furthermore, the component 10 has a polymer lid plate 34, in which fiber guide structures 14 and openings 22 are likewise disposed. Both the polymer substrate plate 32 and the polymer lid plate 34 likewise have adjusting structures 36. The adjusting structures 36 are disposed exactly opposite a fiber guide structure 14 after assembly.

The adjusting structures 36 are anisotropically etched in the same, already-described manner as the fiber guide structures 14, preferably in V-shape.

A complete master structure is respectively produced for a polymer substrate plate 32 and a polymer lid plate 34. The layout, that is, the position of fiber guide structures 14, adjusting structures 36 and openings 22, is oriented toward the later design of the complete polymer component 10.

Figure 5:
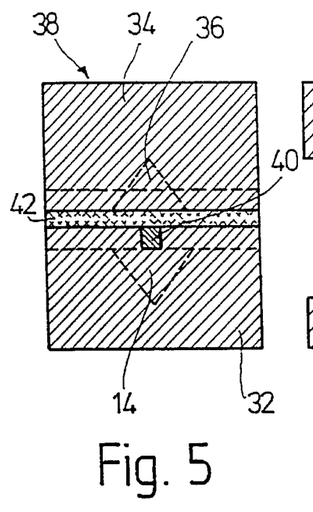
FIG. 5 is a section of a polymer component produced with a negative form represented in FIGS. 3 and 4.
Figure 6:
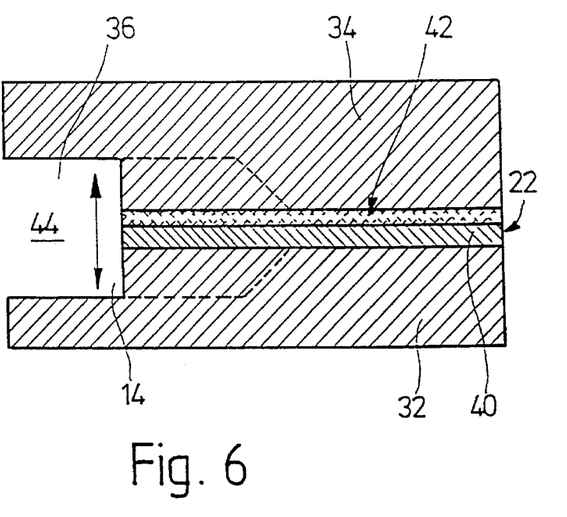
FIG. 6 is a side view according to FIG. 5.

A fiber-chip coupling point 38 of a completed polymer component 10 is shown in its entirety in FIGS. 5 and 6.

The coupling point 36 comprises a fiber guide structure 14 disposed in the substrate plate 32, and a light waveguide 40 poured into the openings 22. The fiber guide structure 14 is allocated an adjusting structure 36 in the lid plate 34. An optical buffer film 42 is provided between lid plate 34 and substrate plate 32. The glass fiber, not shown here, lies in the recess 44 which results when the lid plate 34 is placed on top, and is aligned with its optical axis in that the fiber guide structure 14 is configured lower than the adjusting structure 36, with the optical axis of the light waveguide 40 disposed in the substrate plate 32. Details regarding the low embodiment of the structures 14 and 36 and the thickness of the buffer film 42 are given further below.

Figure 7:
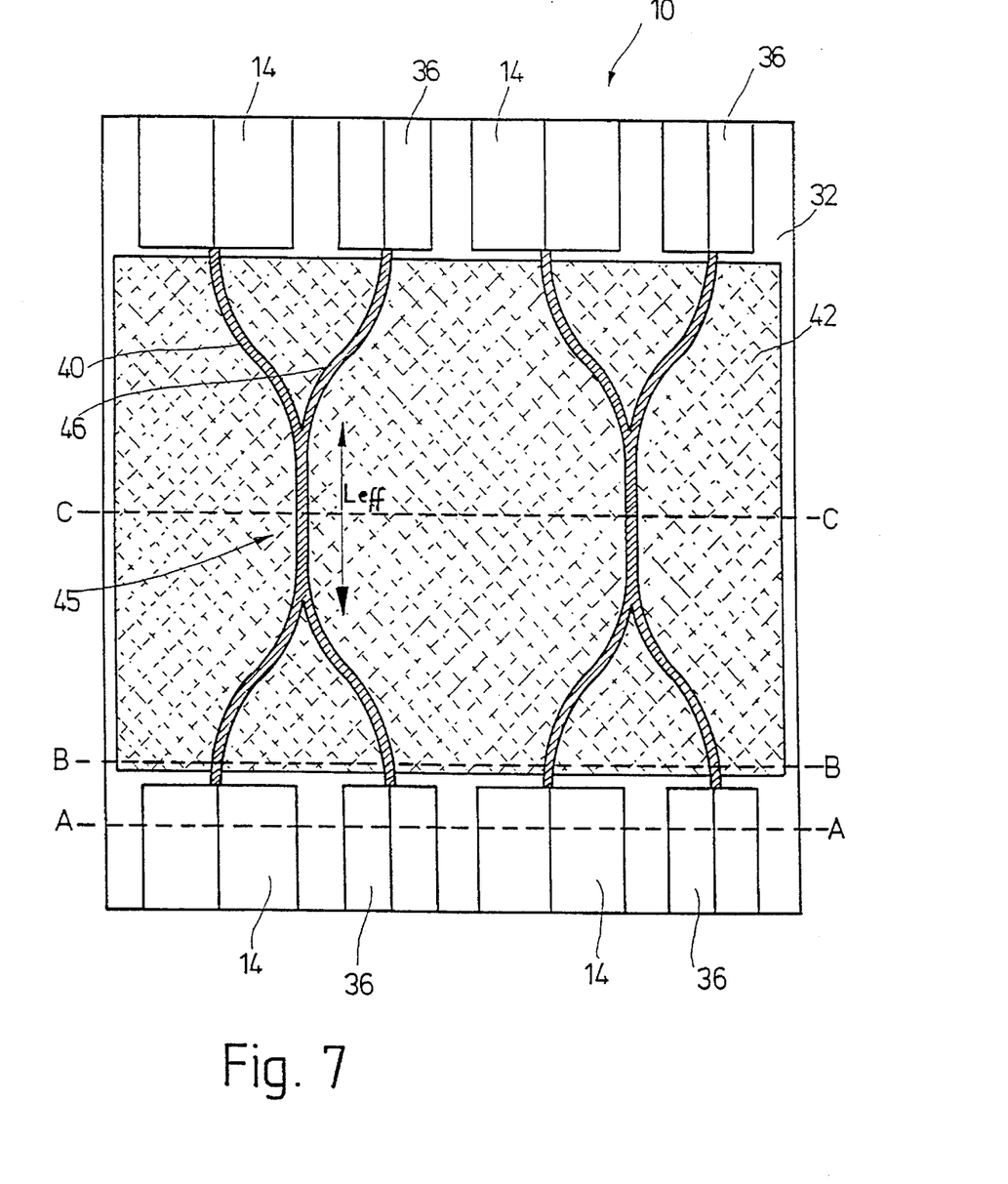
FIG. 7 is a projectional top view of a complete polymer component.

FIG. 7 shows a projectional top view of a polymer component 10 configured as a 2×2-directional coupler.

Polymer substrate plate 32 and lid plate 34 (not shown here) each have fiber guide structures 14 (V-grooves), adjusting structures 36 and waveguide prestructures (openings 22) so that, during the assembly one on top of the other, vertical coupling structures 45 are created that are only separated in superimposed regions of the light waveguides 40, 46 by way of the thickness of an intermediate polymer film (buffer film 42) having suitable optical properties.

In FIG. 7 the light waveguides 40 lie in the polymer substrate plate 32 (below). The associated fiber guide structures 14 (V-trenches) in the view are somewhat wider, so that the (consequently lower-lying) glass fiber axes become aligned with the optical axes of the associated light waveguides 40. The buffer film 42 comes to lie above the light waveguides 40 of the substrate plate 32. The light waveguides 46 (which actually lie on the underside of the polymer lid plate 34) then come into position in an assembled component 10, as shown by way of example. The narrower V-trenches in the substrate plate 32 form the adjusting structures 36 of the glass fibers to be held in the lid plate 34 in the fiber guide structures 14, and thus serve simultaneously to adjust lid plate 34 and substrate plate 32 relative to one another. The coupling distance (film thickness of the buffer film 42) and the effective coupling length $L_{eff}$ (a function of the detailed layout of a coupler) of such a passive directional coupler determine whether, for example, the light is completely overcoupled from the low-lying light waveguide 40 into the upper-lying light waveguide 46, or is divided in a determined ratio between the two light waveguides 40, 46.

Figure 8:
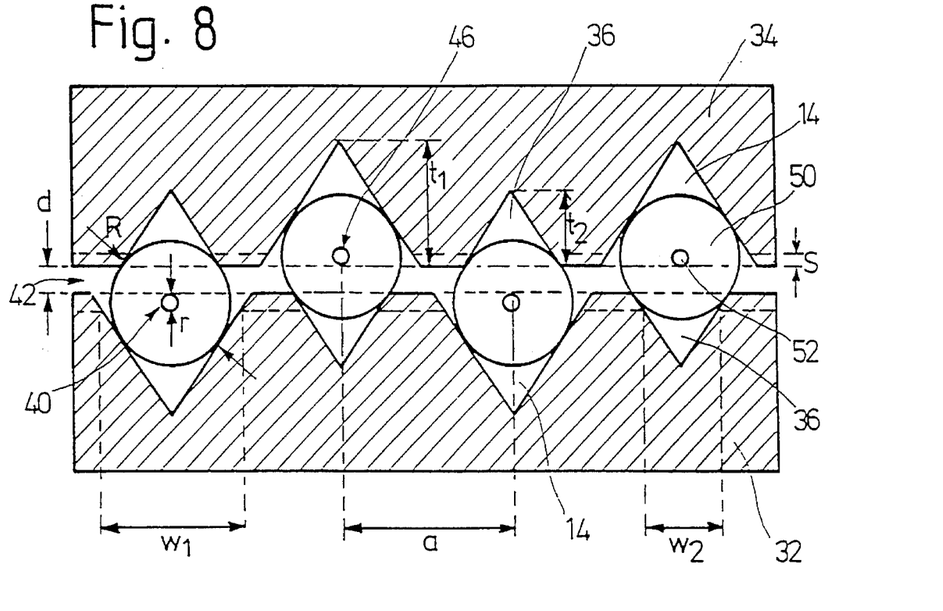
FIG. 8 is a section along line A—A from FIG. 7.
Figure 9:
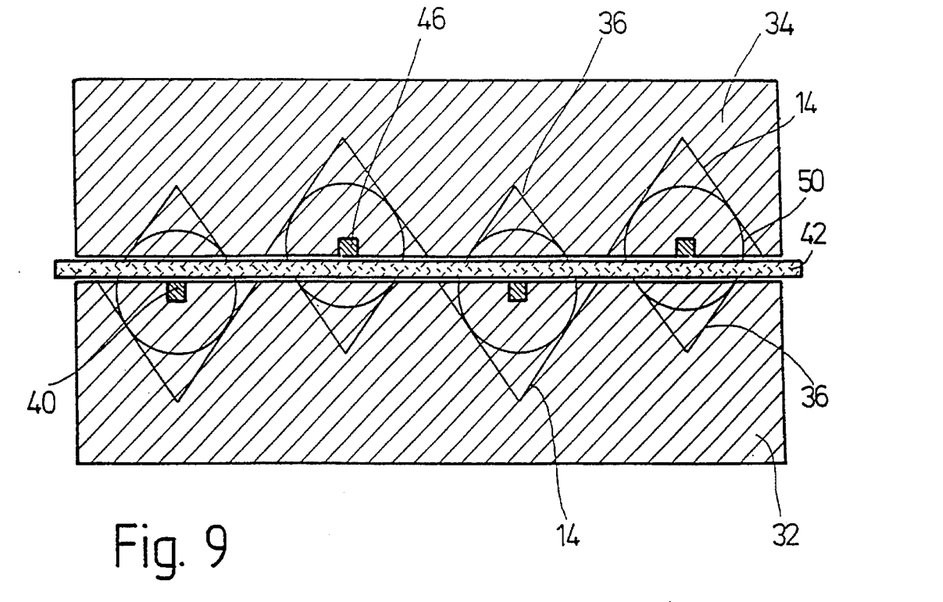
FIG. 9 is a section along line B—B from FIG. 7.
Figure 10:
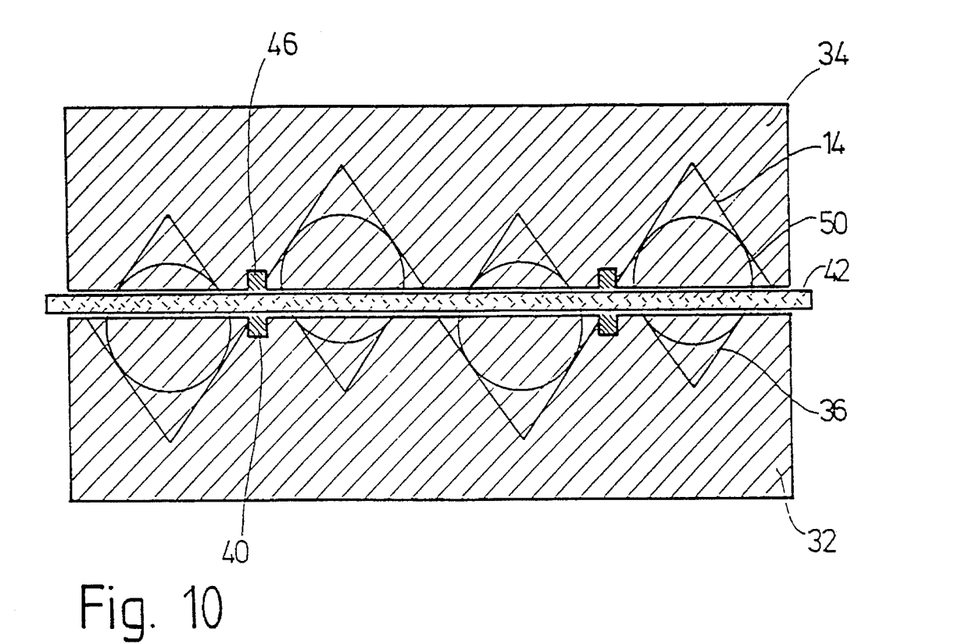
FIG. 10 is a section along line C—C from FIG. 7.

The precise design of the component 10 is explained by way of the cross-sections of lines A—A, B—B, C—C shown in FIGS. 8 through 10.

FIG. 8 shows a section through the region of the fiber guide structures 14 and the adjusting structures 36 with inserted glass fibers 50.

Typical values for glass fibers 50 are R=125 µm for the fiber jacket diameter and r=9 µm for the field diameter of a glass fiber core 52. The glass fibers 50 are disposed laterally in a grid a (typically 250 µm), with the glass fibers 50 lying so as to fit exactly with respect to the optical axes of the light waveguides 40, 46 to be respectively contacted by them and which are in the substrate plate 32 or lid plate 34. With an assumed depth s of the light waveguides 40, 46, this presupposes a vertical offset by d+2(s/2)=d+s (d is the distance between substrate plate 32 and lid plate 34 determined by the thickness of the buffer film 42). The depths of the polymer guide structures $t_1$ and $t_2$ (fiber guide structure 14 or adjusting structure 36) result here from the depth of the respective V-groove etched into silicon plus the thickness s of the polymer cover layer (photoresist) on the master structure, into which the openings 22 were structured (corresponds to the depth of the light waveguides 40, 46). After the master structure was galvanically shaped and injection-molded, there is, of course, a difference between original Si surface 18 and polymer cover layer 20 in the polymer structures of FIG. 7 is no longer possible—hence, a horizontal dashed line was respectively drawn for clarification of this.

The widths of the V-grooves $w_1$ to be etched into the silicon master structures for the fiber guide structures 14 and $w_2$ for the respective V-shaped adjusting structures 36 on the opposite polymer plate are easy to calculate in this example:

$$w_1 = \frac{R}{\sin\alpha} - \frac{2\delta_i}{\tan\alpha}$$

In the example given, $w_1$=148.8 µm (for $\delta_1$=3 µm) and $w_2$=126.2 µm (for $\delta_2$=d+3/2 s=19 µm).

FIGS. 9 and 10 show cross-sections through the directional coupling component 10 of FIG. 7, with FIG. 9 showing the section (B—B) directly behind the fiber-coupling point, and clarifying the end-to-end coupling of the glass fibers with the light waveguides alternatingly lying in the substrate or lid plate, which coupling is respectively aligned with its optical axes.

FIG. 10 shows the section (C—C) through the center of the coupling region 45, in which the light waveguides 40, 46 come to lie exactly one above the other, and the coupling distance is determined only by way of the thickness d of the buffer film 42. A crucial point here is the exact adjustment of the light waveguides 40, 46 relative to one another, which is effected by means of the V-shaped guides (fiber guide structure 14 and adjusting structure 36) in lid plate 34 and substrate plate 32, and the glass fibers 50 inserted therein, because the V-shaped structures can respectively assume two defined overlay points on the round glass fibers 50 (free from play). By means of the photolithographic production, the guides can be positioned sufficiently precisely laterally with submicrometer precision. During assembly of the components 10, the glass fibers 50 are inserted into their fiber guide structure 14, and then cross-linkable prepolymers (core polymer) are poured into the light-conductive trenches (openings 22) of the substrate plate 32, which thus create the light waveguides 40, the buffer film 42 is placed on top, and the lid plate 34, likewise filled with prepolymer, is pressed on from above. Overhanging prepolymer is pressed away with this assembly technique and, after its cross-linking, assures a tabular connection. As a function of the viscosity of the prepolymer, a thin, tabular residual layer thickness of the same must possibly be included in determining the film thickness of the buffer film.

A simple estimate shows that the coupling distance k (calculated between light waveguide centers) varies with $\Delta k^2=(d+s)^2+\Delta y^2$.

With the data from the above example, changes in the coupling distance $\Delta k$=0.5 µm result from a lateral mismatch of the light waveguides of $\Delta y$=4 µm (assuming radially symmetrical optical fields).

For simplified assembly, the polymer film 42 need not necessarily be guided up to the light waveguide ends of the light waveguides 40, 46 to fit exactly. Because of the very slight index differences of the waveguide core and substrate/film, the exit aperture angles at the light waveguide ends are very small (similar to those of the monomode fibers). Because the prepolymer, like an index liquid, guides the fields up to the end surface of the glass fibers, the actual light waveguide 40, 46 can already end in distances of approximately 20–50 µm in front of the glass fiber end, with tolerably small coupling losses. Tolerances of the film dimensions of this magnitude are therefore allowed in the light waveguide direction.

Figure 11:
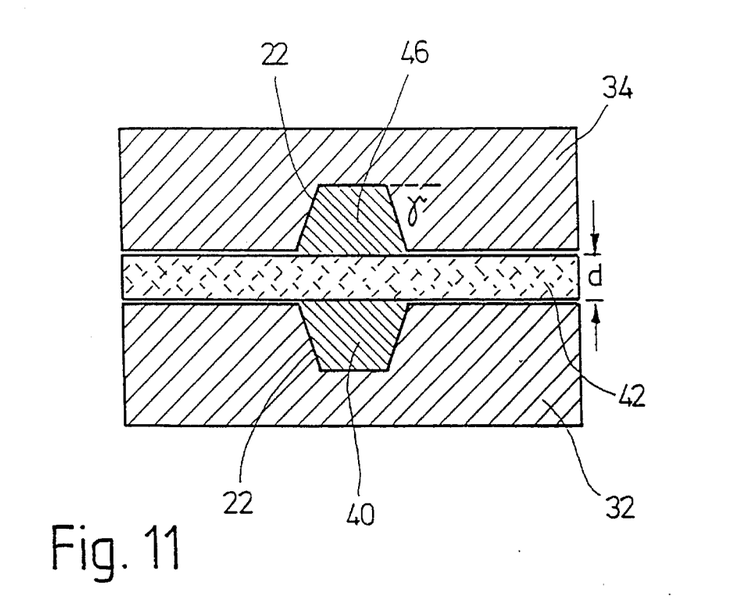
FIG. 11 is a coupling structure in detail.

FIG. 11 shows a detailed coupling region 45 in section.

The cross-section dimensions of the light waveguide trench structures (openings 22) are to be dimensioned so as to be as independent as possible of the light wavelength to be guided, on the one hand, and, on the other hand, that the radially symmetrical field distribution of the glass fibers 50 is approached as closely as possible in order to achieve high degrees of coupling efficiency. For this purpose the refraction index of the light-guiding polymer (waveguide core) in the openings 22 must be slightly higher than the refraction indices of substrate plate 32, lid plate 34 and buffer film 42. Typical cross-section dimensions for monomode components at $\lambda$=1300 nm are 6 µm×6 µm with an index difference $n_{core}-n_{substrate}$ 0.003. Corresponding to FIG. 11, the flanks of the light waveguides 40, 46 can advantageously be inclined by an angle of 70°≦γ90° in order to permit a simpler removal from the mold in injection molding (trapezoidal cross-section). The optimum thickness for an optical buffer film 42 is extremely dependent on its refractive index. For an assumed refraction index similar to the one of the substrate in the above example, the thickness could then be, for example, 10 µm (in individual cases, the optimum layout of the directional coupler structures must be adapted to the field distributions and coupling distances).

Figure 12:
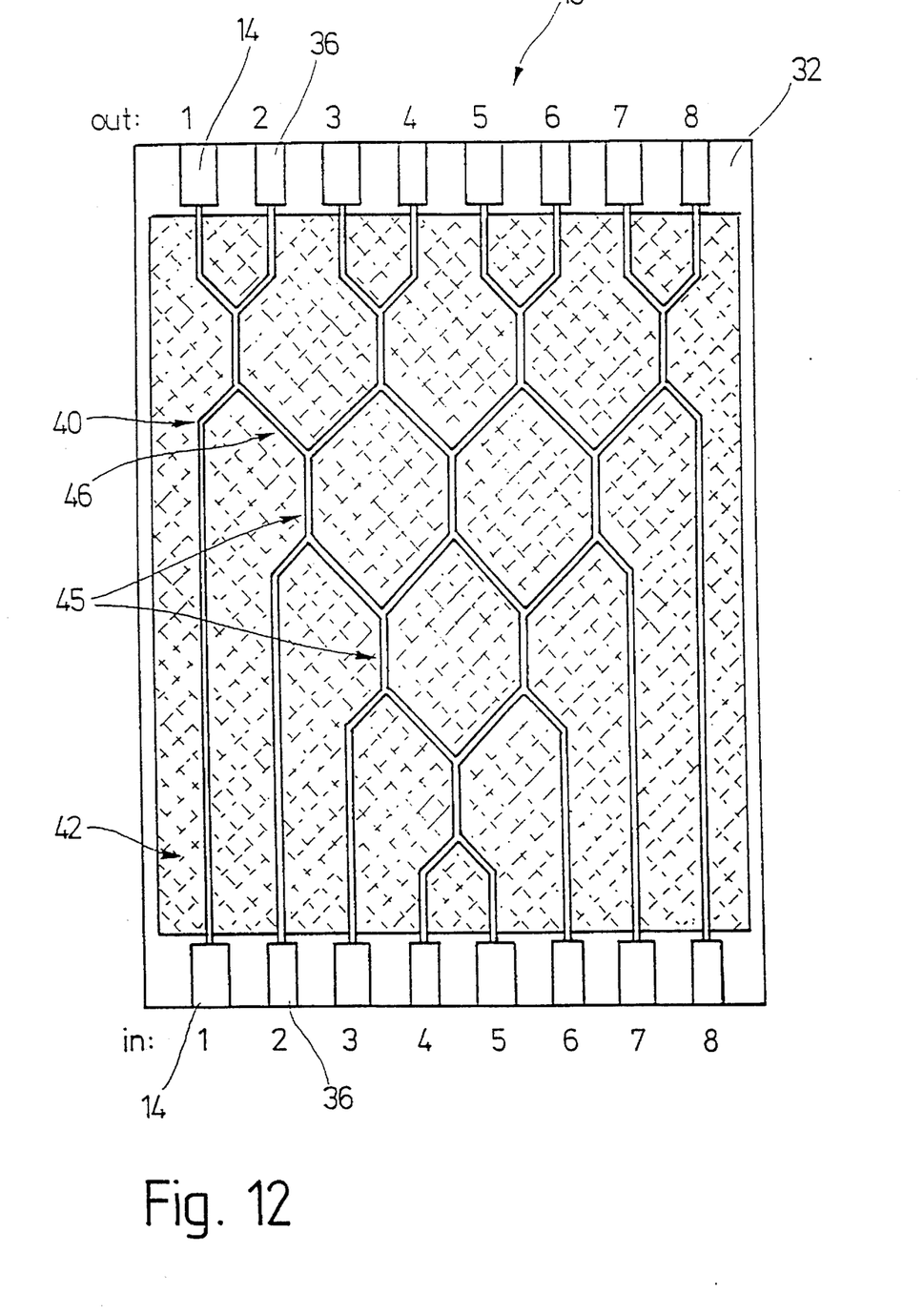
FIG. 12 is a projectional top view of a further polymer component.

FIG. 12 shows a projectional top view of a 1×8 power divider as an example of a further polymer component 10. The component possesses inputs 1 through 8 and outputs 1 through 8, which are respectively connected to one another by means of light waveguides 40, 46.

As in FIG. 7, a top view of the substrate plate 32 with its light waveguides 40 and fiber guide structures 14 is represented. Shown opposite are the buffer film 42 and the imaginary position of the light waveguides 46 lying in the lid plate 34. Furthermore, for a simplified representation, the individual S-shaped light waveguide bendings at the inputs and outputs of each coupling region 45 are only schematically represented, respectively by a diagonal connection. It is shown how, for example, alternating light waveguides 40, 46 from the upper and the lower plane (substrate plate 32, lid plate 34) can be coupled with one another in order to achieve an optical signal division of an input (e.g. input No. 5) onto the outputs 1 through 8. In the example shown, the signal power (disregarding losses) would be 1/16 of the input power at the outputs 3, 4, 5, 6.

Figure 13:
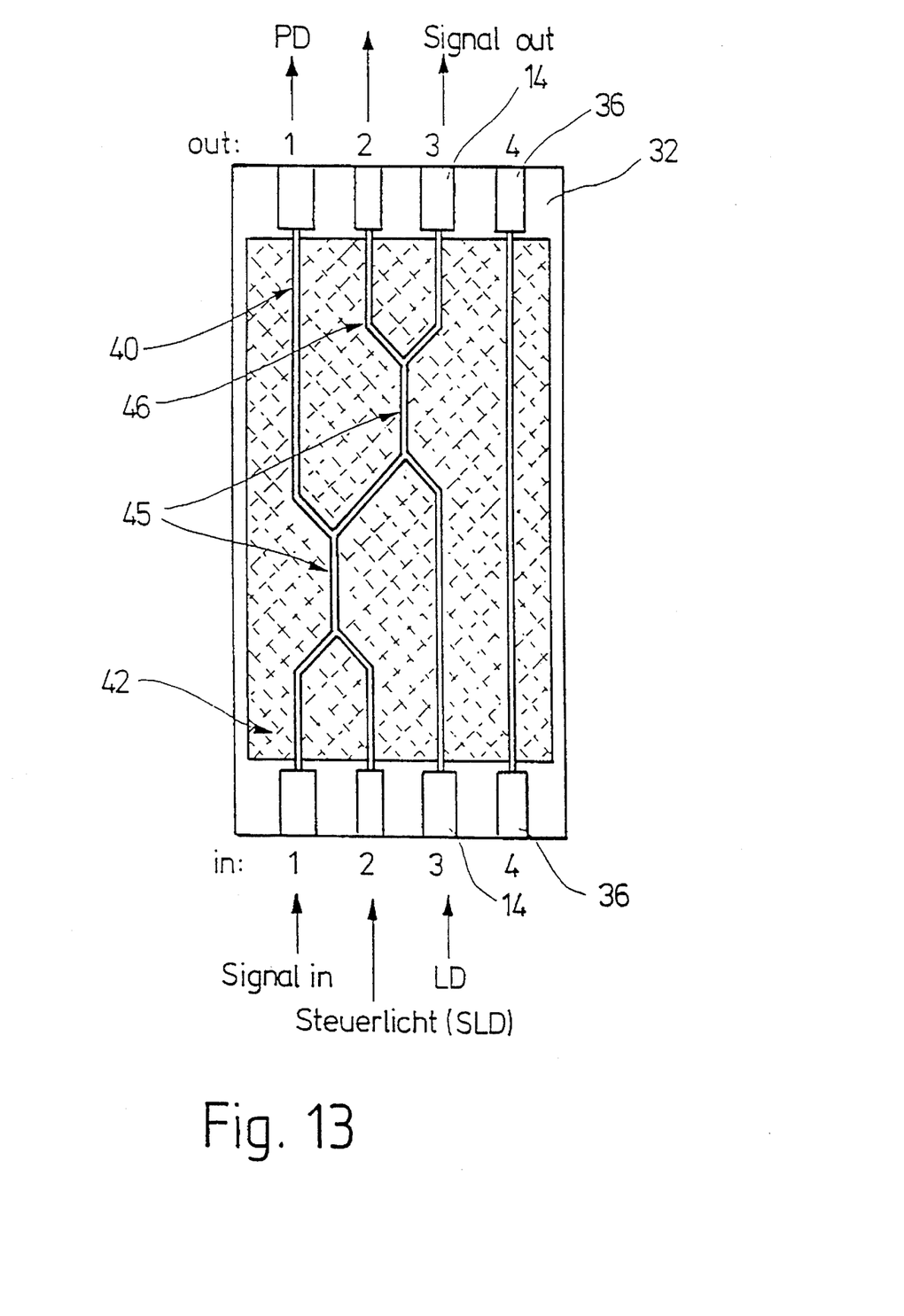
FIG. 13 is a projectional top view of aa further polymer component.

FIG. 13 illustrates a further embodiment which shows an optically-controlled optical switch. By way of example, the switching function is described here by way of an optical bypass switch; analogous expansions of the switching principle up to switching matrices for switching functions are possible.

For principle production and construction, refer to the explanations already given for the other examples.

In the normal state, the incident signal light is guided from input 1 to the photodiode (PD) at output 1, and the light of a local transmitting laser (LD) is conducted by way of the input 3 to the output 3 (input 4 is not engaged). A directional coupler 45 is passed through respectively on the two light paths in the "bar" state, i.e. the light is not overcoupled from the lower light waveguide 40 into the upper light waveguide 46. This is achieved by means of a deliberate detuning ($\Delta\beta$) of the expansion constants ($\beta$) in the upper light waveguide 46 with an optically-induced change in the refraction index in the upper light waveguide 46: for this purpose this can include, for example, a non-linear-optical $X^{(3)}$ polymer which lowers its refraction index slightly by means of an additional irradiated control signal. If the control light signal is deactivated, the reduction in the index disappears, and the directional couplers 45 are respectively switched into the "cross" state, i.e. the input signal light goes to output 3 and the light of the transmitting laser goes into the non-engaged output 2 (sink). This switching function would be practical during, for example, interference (voltage breakdown) of a subscriber station, during which this station would then be bridged until the control light beam is reactivated. The control light can be generated locally in the receiver station (for example by means of an SLD coupled directly to the optical polymer chip) or fed by way of a fiber over the local network (optical "remote" switch).

Whereas the $X^{(3)}$ nonlinearities are normally very small, and would require unacceptably high control light outputs, so-called cis/trans nonlinearities (molecular structure changes) already assure sufficiently dramatic changes in refractive index of $\Delta n \sim 0.0008$ at light outputs of a few~m Watts, but usually at the expense of the switching speeds. For example, "methyl red derivatives" can be dissolved in prepolymers (e.g. epoxy resins) and thus poured into the light-conductive trenches openings 22) as core material and cross-linked. Here switching takes place with "red" light in a wavelength range of 600–700 nm. For the control light source, an inexpensive, broadband red laser diode, or even a simple superluminescence diode (SLD) can be used (unlike for the expensive transmitting laser at 1300 nm or 1550 nm), provided that sufficient light output (a few mW) can be coupled into the light waveguide 46. Because the light waveguides 46 are dimensioned in a monomode manner, for example, for 1550 nm, the same light waveguides 46 are multimode for 600–700 nm wavelength, which significantly simplifies light absorption from the control light source. At the same time, the evanescent fields of the shorter wavelength decay considerably faster over the thickness of the buffer film 42, so that practically no control light is overcoupled into the low-lying communication channels (light waveguides 400, whereas the long-wave light can pass through the coupler, depending on the switching state, in the cross or bar state.

The listed switching functions are also to be used analogously, depending on the layout of the directional couplers 45, and the desired system application, such that switching the directional couplers 45 from cross to bar (or vice versa) is effected by means of activating the control light source—the associated switching speeds of known $X^{(3)}$ materials are higher during the activation process.

I claim:

1. A method of producing optical polymer components having integrated vertical coupling structures, wherein the optical polymer components have regions for receiving light waveguides and fiber guide structures, preferably configured as V-shaped positioning trenches, for receiving optical fiber structures to be coupled to the light waveguides, and the polymer components comprise a polymer substrate and a polymer lid plate, said method comprising: forming at least one structure for receiving a light waveguide, and at least two fiber guide structures and at least two adjusting structures on the substrate plate and on the lid plate such that both the substrate plate and the lid plate possess respective fiber guide structures which are located opposite the adjusting structures in the lid plate and substrate plate respectively after assembly, and the respective light waveguide structures of the substrate plate and of the lid plate which connect the fiber guide structures extend parallel to each other in at least one region such that the optical fields in the respective light waveguides can be coupled with one another.

2. Method according to claim 1, wherein said step of forming includes producing a respective master structure for the substrate plate and for the lid plate containing the structure for receiving the light waveguides for the fiber guide structures and for the adjusting structures, on respective silicon substrates, galvanically shaping these master structures to produce negative master structures forms, and using the negative form with polymer plastics, for example in injection-molding or injection-embossing methods, to produce daughter copies identical to the master structure.

3. Method according to claim 2, wherein said step of producing includes anisotropically etching the fiber guide structure and the adjusting structure into a silicon substrate or another crystal to produce V-shaped structures, filling these etched-in V-shaped structures with polymer materials so that a planar surface is created, coating the planar surfaces with a photoresist or another polymer that can be structured, etching trench-shaped openings that will later form the light waveguides into the polymer coating, and opening the fiber guide structures and the adjusting structures by means of laser ablation.

4. Method according to claim 3, wherein said step of opening includes opening the fiber guide structures and the adjusting structures such that surfaces extending perpendicular to the axial direction of the fiber guide and adjusting structures, and forming a stop, are created at the end of the structures later on the side of the light waveguides.

5. Method according to claim 1, wherein said step of forming includes producing trench-shaped openings, that later receive the light waveguides, which are structured such that they respectively connect respective fiber guide structures located opposite one another in the substrate plate or in the lid plate, and such that they have at least one region in which, after assembly, the opening for the light waveguide in the substrate plate extends, vertically spaced, parallel to the opening for the light waveguide in the lid plate.

6. Method according to claim 5 wherein said step of forming further includes forming the fiber guide structures so that they extend so far into the respective substrate plate or lid plate that the optical axes of optical fibers inserted into the respective fiber guide structures are aligned with the optical axes of the light waveguides poured into the associated openings.

7. Method according to claim 6 wherein the step of forming further includes forming the adjusting structures more shallowly by the amount by which the fiber guide structures are formed more deeply.

8. Method according to claim 1, wherein the vertical coupling distance of the parallel-guided light waveguides is determined by an optical buffer film inserted between the substrate plate and the lid plate during assembly (36).

9. Method according to claim 1, further comprising setting the degree of coupling between the light waveguides disposed in the substrate plate and in the lid plate by the length of the parallel-guided region and the optical thickness of an optical buffer film inserted between the substrate plate of the lid plate during assembly.

10. Method according to claim 9 wherein the degree of coupling is set further by the refraction indices of a light-conducting polymer which creates the light waveguides, the substrate plate, the lid plate and the buffer film.

11. Method according to claim 1, wherein said step of forming includes producing a number of the fiber guide structures and adjusting structures and trench-shaped openings which later form the light waveguides on the substrate plate (32) and on a lid plate with the trench shaped openings of the substrate plate each having at least one region which, after assembly, extends vertically spaced and parallel to at least one region of at least one trench-shaped opening of the lid plate, and with the trench shaped openings of the lid plate having at least one region which, after assembly, extends vertically spaced and parallel to at least one region of at least one opening of the substrate plate.

12. Method according to claim 5 further comprising pouring different light-conducting polymers having different thermo-optical, nonlinear-optical or acousto-optical properties into the openings in the substrate plate and in the lid plate to form the light waveguide.

13. Method according to claim 1, further comprising inserting an outwardly-guided buffer film having electrodes between the substrate plate and lid plate such that the electrodes lie in the region adjacent to at least one vertical coupling point.

14. Method according to claim 1, wherein switching functions, for example by means of thermo-optical effects or acoustic waves stimulated in piezoelectric film material by means of interdigital electrodes, are carried out on the light waveguides in the coupling region.

15. Optical polymer component having vertical coupling structures, produced in accordance with the method forming the basis of claim 1.

16. Method according to claim 1, further comprising: inserting the ends of respective optical fibers into the respective fiber guide structures of the substrate plate and of the lid plate; and placing the lid plate on the substrate plate such that each inserted end of each optical fiber is disposed between a respective fiber guide structure on one of the substrate plate and the lid plate and a respective adjusting structure on the other of the substrate plate and the lid plate.

17. Method according to claim 16, further comprising: inserting an optical buffer film between the substrate plate and the lid plate to set the vertical coupling distance of the parallel-guided light waveguides.

* * * * *